(12) United States Patent
Niwa et al.

(10) Patent No.: US 10,476,482 B2
(45) Date of Patent: Nov. 12, 2019

(54) FILTERS INCLUDING LOOP CIRCUITS FOR PHASE CANCELLATION

(71) Applicant: SKYWORKS SOLUTIONS, INC., Woburn, MA (US)

(72) Inventors: Satoshi Niwa, Taito-Ku (JP); Yoshiaki Ando, Yokosuka (JP); Hiroyuki Nakamura, Osaka-Fu (JP)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 79 days.

(21) Appl. No.: 15/817,782

(22) Filed: Nov. 20, 2017

(65) Prior Publication Data

US 2018/0152191 A1    May 31, 2018

Related U.S. Application Data

(60) Provisional application No. 62/484,654, filed on Apr. 12, 2017, provisional application No. 62/427,341, filed on Nov. 29, 2016.

(51) Int. Cl.
*H03H 9/64* (2006.01)
*H03H 9/54* (2006.01)
(Continued)

(52) U.S. Cl.
CPC ....... *H03H 9/6483* (2013.01); *H01L 41/0471* (2013.01); *H01P 1/205* (2013.01);
(Continued)

(58) Field of Classification Search
CPC ....... H03L 7/093; H04B 1/525; H04B 1/0458; H04B 1/18; H04B 1/1036; H03H 9/6436;
(Continued)

(56) References Cited

U.S. PATENT DOCUMENTS 4,799,029 A    1/1989  Minomo
4,906,885 A    3/1990  Kojima et al.
(Continued)

FOREIGN PATENT DOCUMENTS

JP    S62261211 A    11/1987
JP    H08316773 A    11/1996
(Continued)

*Primary Examiner* — Robert J Pascal
*Assistant Examiner* — Jorge L Salazar, Jr.
(74) *Attorney, Agent, or Firm* — Lando & Anastasi, LLP

(57) ABSTRACT

Aspects and examples provide improvement in the attenuation level near the passband within the stopband of the bandpass-type filter using a ladder-type circuit formed by a BAW resonator. In one example the filter includes a ladder-type circuit formed by a bulk acoustic wave (BAW) resonator, and a loop circuit connected between two distinct points on a signal path extending from an input to an output of the ladder-type circuit for phase-cancellation of signals at the two distinct points. The two distinct points may be the input and the output of the ladder-type circuit. The loop circuit may include a SAW resonator or a BAW resonator. The BAW resonator may be a film bulk acoustic resonator (FBAR) or solidly mounted resonator (SMR).

20 Claims, 9 Drawing Sheets

(51) Int. Cl.
*H03L 7/093* (2006.01)
*H01P 1/205* (2006.01)
*H03H 9/02* (2006.01)
*H01P 1/20* (2006.01)
*H04B 1/10* (2006.01)
*H01L 41/047* (2006.01)
*H03H 9/56* (2006.01)
*H03H 9/60* (2006.01)
*H03H 9/70* (2006.01)
*H04B 1/04* (2006.01)
*H04B 1/18* (2006.01)
*H04B 1/525* (2015.01)
*H01P 1/213* (2006.01)

(52) U.S. Cl.
CPC ....... *H01P 1/2005* (2013.01); *H03H 9/02047* (2013.01); *H03H 9/542* (2013.01); *H03H 9/547* (2013.01); *H03H 9/568* (2013.01); *H03H 9/605* (2013.01); *H03H 9/6436* (2013.01); *H03H 9/706* (2013.01); *H03L 7/093* (2013.01); *H04B 1/0458* (2013.01); *H04B 1/1036* (2013.01); *H04B 1/18* (2013.01); *H04B 1/525* (2013.01); *H01P 1/213* (2013.01)

(58) Field of Classification Search
CPC ........ H03H 9/568; H03H 9/542; H03H 9/605; H03H 9/706; H03H 9/02047; H03H 9/547; H03H 9/6483; H01L 41/0471; H01P 1/2005; H01P 1/205; H01P 1/213
USPC .................................. 333/133, 187, 193–196
See application file for complete search history.

(56) References Cited

U.S. PATENT DOCUMENTS

| | | | |
|---|---|---|---|
| 5,666,091 A | 9/1997 | Hikita et al. | |
| 5,682,126 A | 10/1997 | Plesski et al. | |
| 5,864,262 A | 1/1999 | Ikada | |
| 5,905,418 A | 5/1999 | Ehara et al. | |
| 5,994,980 A | 11/1999 | Tada | |
| 6,049,260 A | 4/2000 | Yoshimoto et al. | |
| 6,262,637 B1 | 7/2001 | Bradley et al. | |
| 6,404,302 B1 | 6/2002 | Satoh et al. | |
| 6,462,633 B1 | 10/2002 | Ichikawa | |
| 6,677,835 B2 | 1/2004 | Noguchi et al. | |
| 6,707,352 B2 | 3/2004 | Kawaguchi | |
| 7,084,718 B2 | 8/2006 | Nakamura et al. | |
| 7,733,196 B2 | 6/2010 | Tsurunari et al. | |
| 7,941,103 B2 | 5/2011 | Iwamoto et al. | |
| 8,174,339 B2 | 5/2012 | Matsuda et al. | |
| 8,228,137 B2 | 7/2012 | Inoue et al. | |
| 8,378,760 B2 | 2/2013 | Iwaki et al. | |
| 8,618,992 B2 | 12/2013 | Fujiwara et al. | |
| 9,118,303 B2 | 8/2015 | Inoue | |
| 9,219,467 B2 | 12/2015 | Inoue et al. | |
| 9,246,533 B2 | 1/2016 | Fujiwara et al. | |
| 2004/0130411 A1* | 7/2004 | Beaudin | H03H 9/14547 333/133 |
| 2004/0246077 A1 | 12/2004 | Misu et al. | |
| 2007/0024392 A1 | 2/2007 | Inoue et al. | |
| 2007/0090895 A1 | 4/2007 | Nishizawa et al. | |
| 2008/0238572 A1 | 10/2008 | Funami et al. | |
| 2010/0026419 A1 | 2/2010 | Hara et al. | |
| 2010/0102901 A1 | 4/2010 | Tsuda | |
| 2010/0109802 A1 | 5/2010 | Tanaka | |
| 2010/0150075 A1 | 6/2010 | Inoue et al. | |
| 2010/0194494 A1 | 8/2010 | Inoue et al. | |
| 2011/0199169 A1 | 8/2011 | Kadota | |
| 2011/0254639 A1 | 10/2011 | Tsutsumi et al. | |
| 2012/0119847 A1 | 5/2012 | Iwaki et al. | |
| 2013/0113576 A1 | 5/2013 | Inoue et al. | |
| 2013/0147578 A1 | 6/2013 | Hara et al. | |
| 2013/0214873 A1 | 8/2013 | Takamine | |
| 2014/0113571 A1 | 4/2014 | Fujiwara et al. | |
| 2015/0171827 A1 | 6/2015 | Kawasaki | |
| 2016/0105158 A1 | 4/2016 | Fujiwara et al. | |
| 2017/0093373 A1 | 3/2017 | Fujiwara et al. | |
| 2017/0099043 A1 | 4/2017 | Goto et al. | |
| 2017/0331456 A1 | 11/2017 | Ono | |

FOREIGN PATENT DOCUMENTS

| | | |
|---|---|---|
| JP | H09312587 A | 12/1997 |
| JP | 2002158599 A | 5/2002 |
| JP | 2004242280 A | 8/2004 |
| JP | 2006311041 A | 11/2006 |
| JP | 2007124085 A | 5/2007 |
| JP | 2010041141 A | 2/2010 |
| JP | 2010154437 A | 7/2010 |
| JP | 2011160203 A | 8/2011 |
| JP | 2012109818 A | 6/2012 |
| JP | 2013-048491 A | 3/2013 |
| JP | 2013118611 A | 6/2013 |
| WO | 0070758 A1 | 11/2000 |
| WO | 0201715 A1 | 1/2002 |
| WO | 2009025106 A1 | 2/2009 |
| WO | 2010073377 A1 | 7/2010 |

\* cited by examiner

FILTERS INCLUDING LOOP CIRCUITS FOR PHASE CANCELLATION

CROSS REFERENCE TO RELATED APPLICATIONS

This application claims the benefit under 35 U.S.C. § 119(e) of U.S. Provisional Application No. 62/484,654 titled "FILTERS INCLUDING LOOP CIRCUITS FOR PHASE CANCELLATION" filed on Apr. 12, 2017, and of U.S. Provisional Application No. 62/427,341 titled "FILTERS INCLUDING LOOP CIRCUITS FOR PHASE CANCELLATION" filed on Nov. 29, 2016, each of which is herein incorporated by reference in its entirety for all purposes.

BACKGROUND

Conventionally, in a communication device such as a mobile phone, a filtering device has been used to separate signals having different bands, such as a transmission signal and a reception signal, for example. Bulk acoustic wave (BAW) resonators have been used for such filtering devices. The BAW resonators may include film bulk acoustic resonators (FBARs) and solidly mounted resonators (SMRs) formed by multiple acoustic films.

FIG. 1 is a circuit diagram showing an example of a conventional ladder-type bandpass filter formed by FBARs. A ladder-type filter 110 includes series-connected FBARs 111, 113, 115, 117 connected in series along a signal path extending from an input (IN) to an output (OUT). The ladder-type filter 110 further includes parallel-connected FBARs 112, 114, 116 connected in parallel between respective nodes interconnecting the series-connected FBARs 111, 113, 115, 117 and ground.

FIGS. 2A and 2B illustrate a configuration of a conventional electronic device in which the ladder-type filter 110 of FIG. 1 is formed. FIG. 2A is a plan view of the electronic device 100 and FIG. 2B is an end view of the electronic device. The plan view of FIG. 2A corresponds to a cross section taken along line II-II' in FIG. 2B.

In the electronic device 100, series-connected FBARs 111, 113, 115, 117 are disposed in series along a conductive signal path 131 extending from a first signal contact 141 to a second signal contact 143 on the top surface 151a of a piezoelectric substrate 151. The piezoelectric substrate 151 is supported by a support substrate 152. Further, parallel-connected FBARs 112, 114, 116 are connected in parallel between a ground plane 132 and respective nodes interconnecting the series-connected FBARs 111, 113, 115, 117 along the conductive signal path 131. The ground plane 132 connects the parallel-connected FBARS 112, 114, 116 to ground contacts 142, 144, 146.

The electronic device 100 includes a sealing substrate 153, which is disposed to oppose the top surface 151a of the piezoelectric substrate 151 via a certain gap. A side wall 154 formed along the outer periphery on the top surface 151a of the piezoelectric substrate 151 spaces the sealing substrate 153 apart from the piezoelectric substrate 151 and encloses the gap between the piezoelectric substrate 151 and the sealing substrate 153. As shown in the end view of FIG. 2B, external electrodes 155, 156 are disposed on the sealing substrate 153. The external electrodes 155, 156 are connected to suitable signal contacts 141, 143 or to ground contacts 142, 144, 146, 148 by vias (not shown), for example.

SUMMARY OF INVENTION

Aspects and embodiments relate to filters including a ladder-type circuit formed using bulk acoustic wave resonators.

In the conventional ladder-type filter constructed from FBARs as shown in FIGS. 1 and 2A-B, design parameters are optimized between the series-connected FBARs 111, 113, 115, 117 and the parallel-connected FBARs 112, 114, 116 to reduce the loss in the filter's passband and improve the attenuation characteristics within the filter's stopband. However, it is common that there is a trade-off relationship between the passing characteristics and the attenuation characteristics of the filter, such that the attenuation characteristics near the passband are insufficient to provide desired performance.

In view of the above described circumstances, aspects and embodiments of the present invention provide a bandpass filter using a ladder-type circuit formed by BAW resonators, such as FBARs, to improve the attenuation level near the passband within the stopband.

According to one embodiment, a filter includes a ladder-type circuit formed by a plurality of bulk acoustic wave (BAW) resonators, and a loop circuit connected between two distinct points on a signal path extending from an input to an output of the ladder-type circuit for phase-cancellation of signals at the two distinct points.

The two distinct points may be the input and the output of the ladder-type circuit. The two distinct points may be the input of the ladder-type circuit and a node located one BAW resonator away from the output of the ladder-type circuit along the signal path, such that the one BAW resonator is connected in series between the node and the output of the ladder-type circuit.

The loop circuit may include a surface acoustic wave (SAW) resonator or a BAW resonator. The SAW resonator of the loop circuit may form a longitudinal-coupling-type filter.

The BAW resonator forming the ladder-type circuit and the SAW resonator or BAW resonator forming the loop circuit may be disposed on a common substrate. The BAW resonator may be a film bulk acoustic resonator (FBAR) or a solidly mounted resonator (SMR).

According to the certain embodiments, the pass characteristics can be ensured and the attenuation level near the passband within the stopband can be improved. Therefore, the separation characteristics and the isolation characteristics of the filter device can be improved.

According to one embodiment a filtering circuit comprises a ladder-type filter having an input and an output, the ladder-type filter including a plurality of series-arm acoustic wave elements connected in series along a signal path between the input and the output, and a plurality of parallel-arm acoustic wave elements connected between the series path and a ground, and a loop circuit connected in parallel with the ladder-type filter between the input and output. The loop circuit includes an acoustic wave filter, a first capacitor, and a second capacitor, the first capacitor being connected to the input, the second capacitor being connected to the output, and the acoustic wave filter being connected in series between the first and second capacitors and including a first acoustic wave element and a second acoustic wave element, the first and second acoustic wave elements each having a signal electrode and a ground electrode and being arranged such that a direction from the signal electrode to the ground electrode is oriented the same in each of the first and second acoustic wave elements.

In one example of the filtering circuit the acoustic wave filter further includes a third acoustic wave element and a fourth acoustic wave element, and wherein the loop circuit further includes a third capacitor connected between the third acoustic wave element and the input, and a fourth capacitor connected between the fourth acoustic wave element and the output. Each of the third, and fourth acoustic wave elements may include a signal electrode and a ground electrode. The first, second, and third acoustic wave elements may be arranged such that the direction from the signal electrode to the ground electrode is a first direction, and the fourth acoustic wave element may be oriented such that a direction from the signal electrode to the ground electrode is a second direction opposite to the first direction.

In one example the acoustic wave filter is a longitudinally-coupled surface acoustic wave filter, and each of the first and second acoustic wave elements of the loop circuit is a surface acoustic wave element.

In another example each of the first and second acoustic wave elements of the loop circuit is a bulk acoustic wave element, such as a film bulk acoustic resonator or a solidly mounted resonator, for example.

In another example each series-arm acoustic wave element and each parallel-arm acoustic wave element is a bulk acoustic wave element, such as a film bulk acoustic resonator or a solidly mounted resonator, for example.

Another embodiment is directed to a filtering circuit comprising a ladder-type filter including a plurality of series-arm acoustic wave elements connected in series along a signal path between an input and an output, the ladder-type filter further including a plurality of parallel-arm acoustic wave elements connected between the signal path and a ground, and a loop circuit including a first capacitor, a second capacitor, and an acoustic wave filter connected in series between the first capacitor and the second capacitor, the first capacitor being connected to the input, and the second capacitor being connected to a node along the signal path, a first parallel-arm acoustic wave element of the plurality of parallel-arm acoustic wave elements being connected between the node and the ground, and a single series-arm acoustic wave element of the plurality of series-arm acoustic wave elements being connected between the node and the output. The acoustic wave filter includes a first acoustic wave element and a second acoustic wave element, each of the first and second acoustic wave elements having a signal electrode and a ground electrode and being arranged such that a direction from the signal electrode to the ground electrode is oriented the same in each of the first and second acoustic wave elements.

In one example each series-arm acoustic wave element and each parallel-arm acoustic wave element is a bulk acoustic wave element, such as a film bulk acoustic resonator or a solidly mounted resonator, for example.

In one example the acoustic wave filter is a longitudinally-coupled surface acoustic wave filter, and each of the first and second acoustic wave elements of the loop filter is a surface acoustic wave element.

In another example each of the first and second acoustic wave elements of the loop circuit is a bulk acoustic wave element. Each bulk acoustic wave element may be a film bulk acoustic resonator or a solidly mounted resonator, for example.

According to another embodiment a filtering circuit comprises a primary filter and a loop circuit. The primary filter includes a plurality of primary acoustic wave elements constructed and arranged to provide the primary filter with a passband and a stopband, the plurality of primary acoustic wave elements including a plurality of series-arm acoustic wave elements connected in series along a signal path between an input of the filtering circuit and an output of the filtering circuit, and a plurality of parallel-arm acoustic wave elements connected between the signal path and a ground. The loop circuit includes a first capacitor, a second capacitor, and an acoustic wave filter connected in series between the first capacitor and the second capacitor, the first capacitor being connected to a first node of the primary filter, the second capacitor being connected to a second node of the primary filter that is different than the first node. The acoustic wave filter includes a first and second secondary acoustic wave elements each having a signal electrode and a ground electrode and being arranged such that a direction from the signal electrode to the ground electrode is oriented the same in each of the first and second secondary acoustic wave elements. The loop circuit is configured to attenuate a portion of a signal in the stopband of the primary filter by signal phase cancellation.

In one example the acoustic wave filter of the loop circuit is a longitudinally-coupled surface acoustic wave filter, and each of the first and second acoustic wave elements is a surface acoustic wave element.

In one example the first node is the input of the primary filter and the second node is the output of the primary filter.

In another example the first node is the input of the primary filter, a first parallel-arm acoustic wave element of the plurality of parallel-arm acoustic wave elements is connected between the second node and the ground, and at least one series-arm acoustic wave element of the plurality of series-arm acoustic wave elements is connected between the second node and the output of the primary filter.

In one example each of the primary acoustic wave elements is one of a film bulk acoustic resonator and a solidly mounted resonator.

According to another embodiment a filtering assembly comprises a piezoelectric substrate, first and second signal contacts disposed on a surface of the piezoelectric substrate, and a primary acoustic wave filter disposed on the surface of the piezoelectric substrate, the primary acoustic wave filter including a plurality of primary series-arm acoustic wave elements connected in series via a first conductive signal track between the first signal contact and the second signal contact, and a plurality of primary parallel-arm acoustic wave elements connected between the conductive signal track and a ground, the plurality of primary series-arm acoustic wave elements and the plurality of primary parallel-arm acoustic wave elements together configured to provide the primary filter with a passband and a stopband, the conductive signal track including a first node and a second node. The filtering assembly further comprises a first capacitor disposed on the surface of the piezoelectric substrate and connected to the first node, a second capacitor disposed on the surface of the piezoelectric substrate and connected to the second node, and a secondary acoustic wave filter disposed on the surface of the piezoelectric substrate, the secondary acoustic wave filter including a plurality of secondary acoustic wave elements constructed and arranged in series between the first node and the second node, the secondary acoustic wave filter being configured to attenuate a portion of a signal in the stopband of the primary acoustic wave filter via phase cancellation.

In one example the secondary acoustic wave filter includes a first secondary acoustic wave element connected to the first capacitor and a second secondary acoustic wave element connected to the second capacitor.

In one example the first node includes the first signal contact and the second node includes the second signal contact.

In another example at least one of the plurality of primary series-arm acoustic wave elements is connected along the conductive track between the first node and the second node.

The filtering assembly may further comprise a sidewall disposed along an outer periphery of the surface of the piezoelectric substrate. In one example the filtering assembly further comprises a sealing substrate disposed on the sidewall forming a cavity between the surface of the piezoelectric substrate, an inner surface of the sidewall, and a surface of the sealing substrate. The filtering assembly may further comprise first and second external electrodes each disposed on the sealing substrate and connected to the corresponding first and second signal contacts through respective conductive vias.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Various aspects and examples of filters according to embodiments of the present invention are described below in detail with reference to the drawings.

Figure 3:
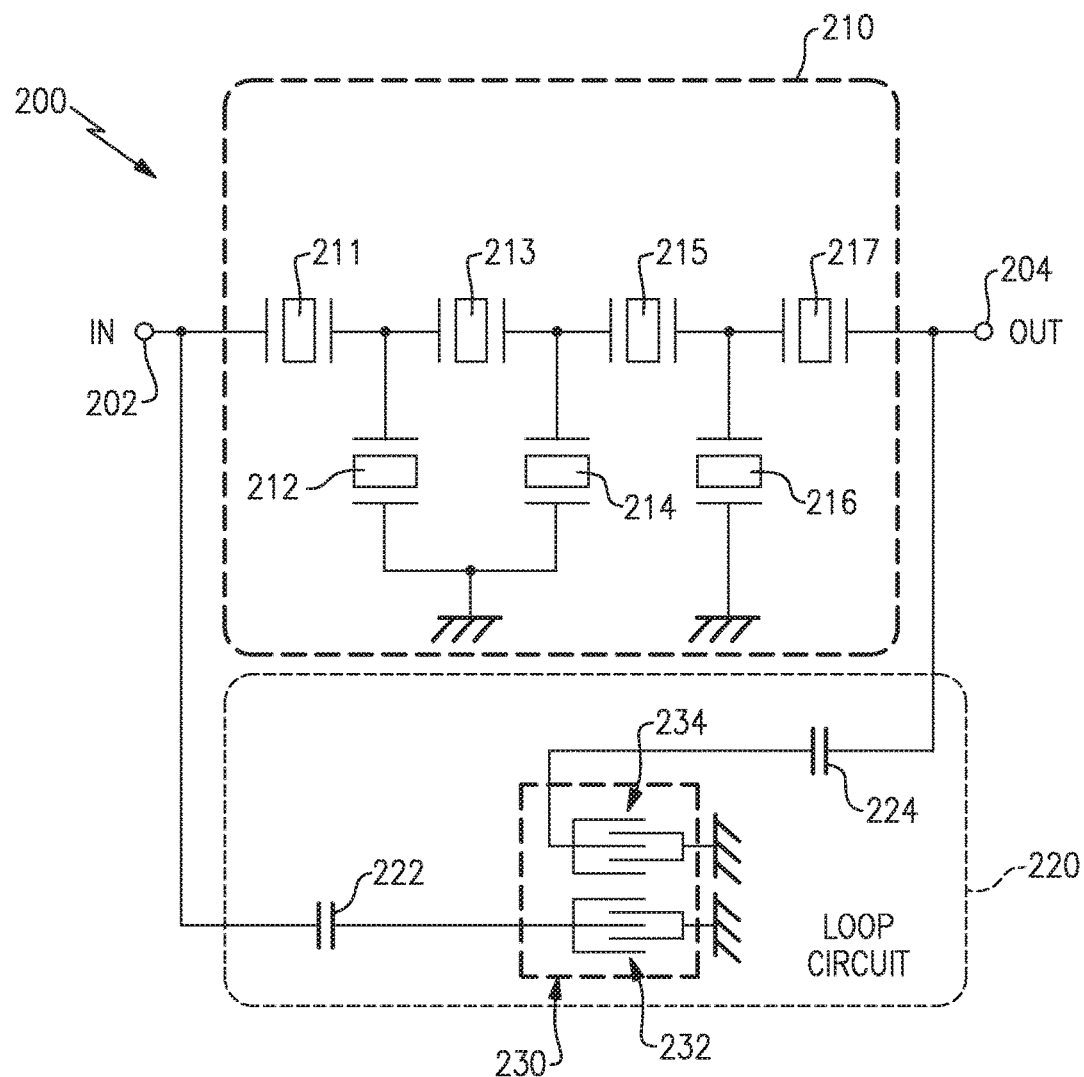
FIG. 3 is a circuit diagram showing a configuration of a filter according to one embodiment.

FIG. 3 is a circuit diagram showing a filter according to one embodiment. In this embodiment film bulk acoustic resonators (FBARs) are used for bulk acoustic wave (BAW) resonators forming the filter. As shown in FIG. 3, the filter 200 according to one embodiment includes a ladder-type filter circuit 210 formed by FBARs and disposed between an input (IN) 202 and an output (OUT) 204. Further, a loop circuit 220 is disposed between the input 202 and the output 204, connected in parallel with the ladder-type filter circuit 210.

In the ladder-type filter circuit 210, series-connected FBARs 211, 213, 215, 217 are connected in series along a signal path extending from the input 202 to the output 204. Further, parallel-connected FBARs 212, 214, 216 are connected in parallel between respective nodes interconnecting the series-connected FBARs 211, 213, 215, 217 and ground. In this example, each of the parallel-connected FBARs 212, 214 is connected at one end to the ground through a common node, as shown in FIG. 3.

The loop circuit 220 includes a longitudinal-coupling-type SAW filter 230. In one example, the SAW filter 230 includes a first SAW resonator 232 connected to the input 202 and a second SAW resonator 234 connected to the output 204. The first SAW resonator 232 and the second SAW resonator 234 are arranged adjacent to each other to form the longitudinal-coupling-type filter 230 such that the directions from the signal electrodes to the respective ground electrodes of the SAW resonators 232, 234 can be oriented the same.

Further, the loop circuit 220 includes a first capacitor 222 disposed between the input 202 and the longitudinal-coupling-type SAW filter 230. Still further, the loop circuit 220 includes a second capacitor 224 disposed between the SAW filter 230 and the output 204.

Figure 1:
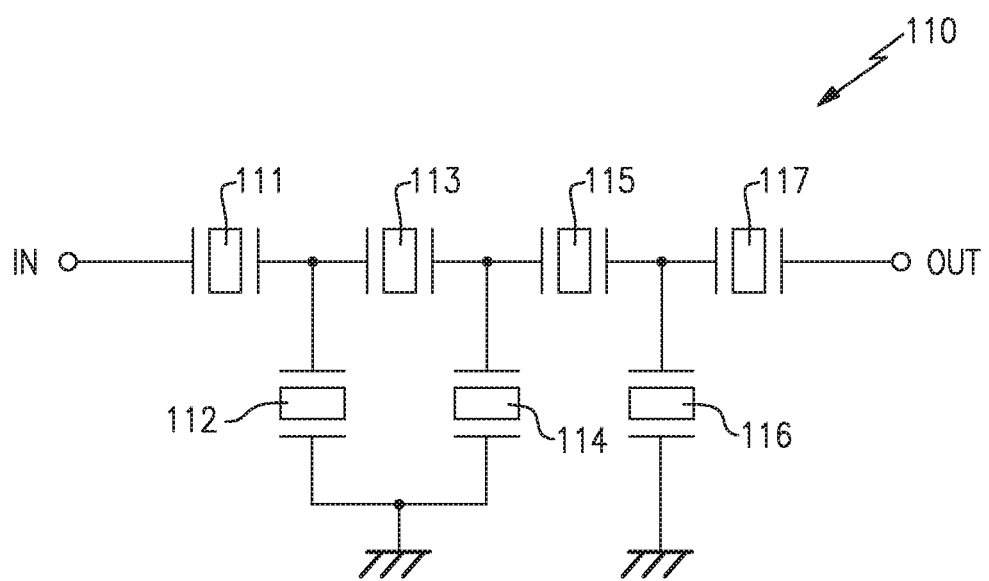
FIG. 1 is a circuit diagram showing a configuration of a conventional ladder-type filter using FBARs.
Figure 2A:
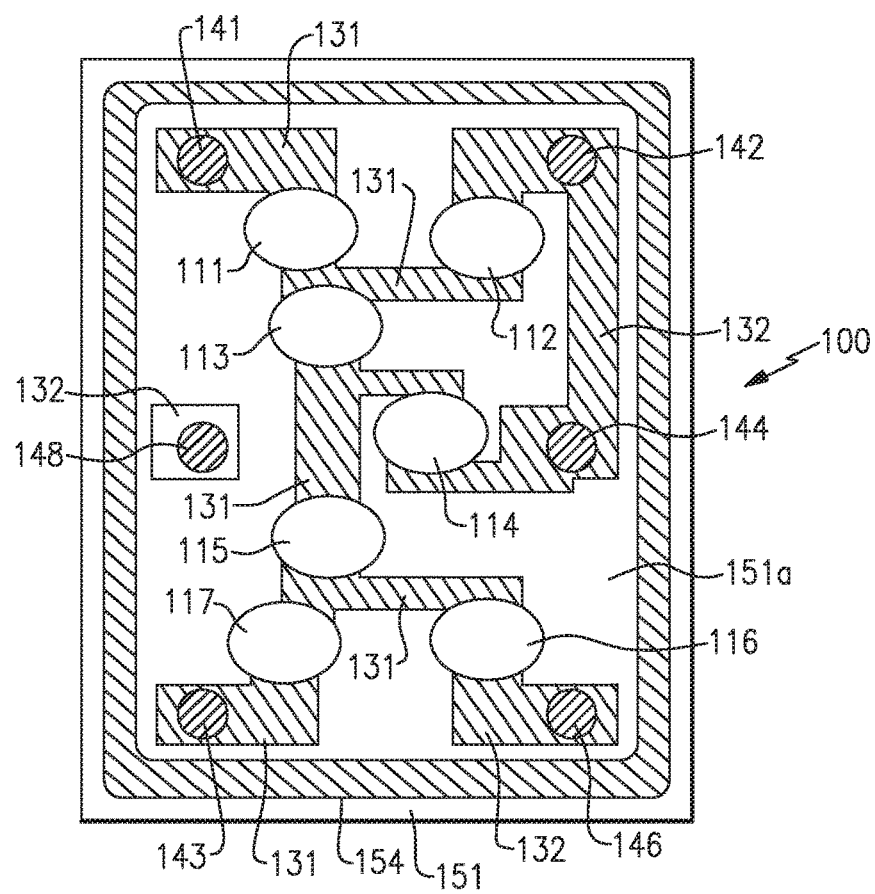
FIG. 2A is a plan view of a conventional electronic device including a ladder-type filter formed using FBARs.
Figure 2B:
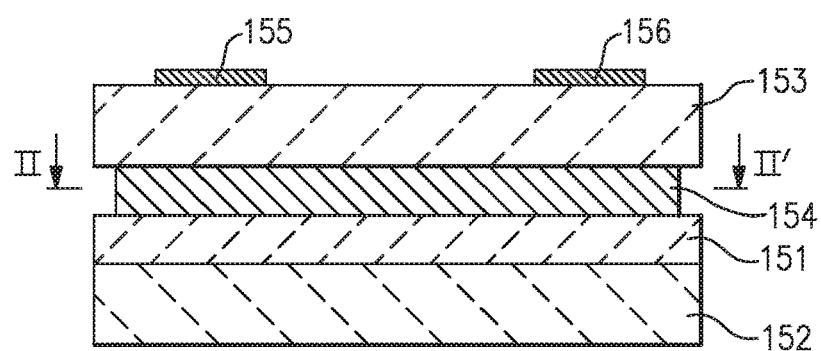
FIG. 2B is an end view of the conventional electronic device of FIG. 2A.
Figure 4A:
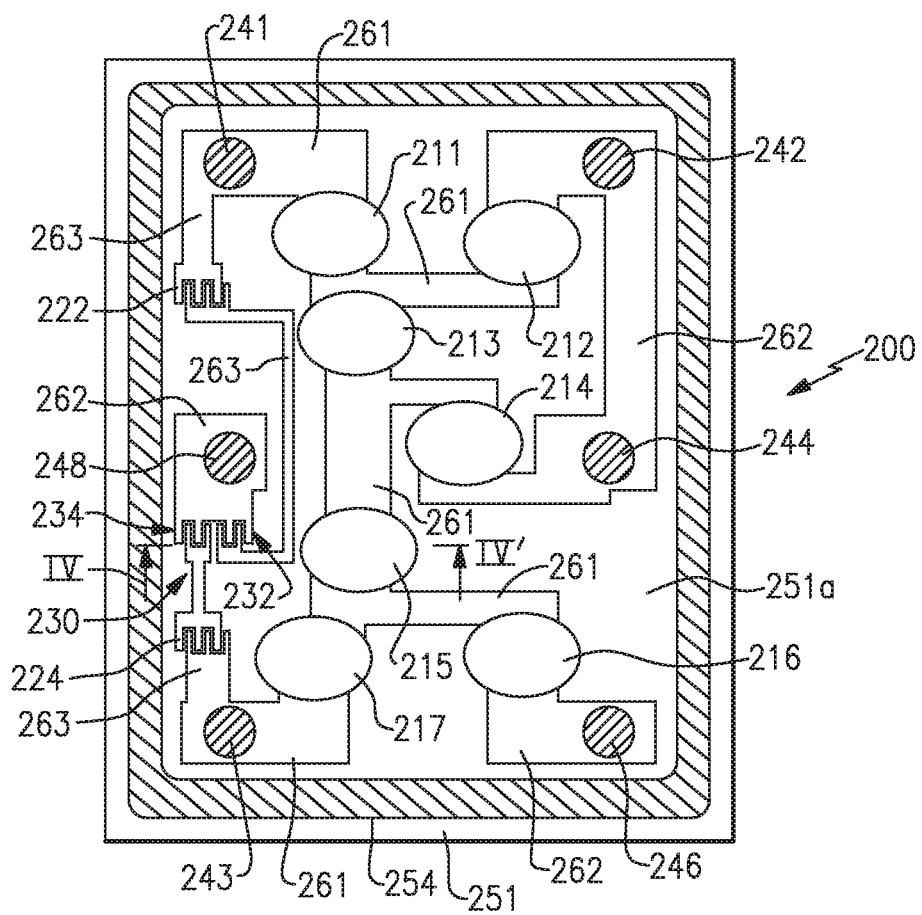
FIG. 4A is a top view of one example of the filter of FIG. 3 according to certain aspects.

FIG. 4A is a plan view of one example of the filter of FIG. 3. The end view of the filter is similar to that of the conventional electronic circuit as shown in FIG. 2B. Corresponding components of the filter 200 are designated by like reference numerals with the circuit diagram as shown in FIG. 3.

The filter 200 includes a piezoelectric substrate 251 made of piezoelectric body such as aluminum nitride (AlN) and zinc oxide (ZnO). The ladder-type filter circuit 210 and the loop circuit 220 are formed on a flat top surface 251a of the piezoelectric substrate 251. The piezoelectric substrate 251 has a suitable thickness to form a piezoelectric film of the FBARs 211-217. Further, a side wall 254 is formed along the outer periphery on the top surface 251a of the piezoelectric substrate 251 to enclose the electronic circuit of the filter 200. The series-connected FBARs 211, 213, 215, 217 of the ladder-type filter circuit 210 are disposed on the top surface 251a of the piezoelectric substrate 251 along a conductive signal track 261, which corresponds to a signal path extending from a signal contact 241 at the input 202 to a signal contact 243 at the output 204. Further, the parallel-connected FBARs 212, 214, 216 are formed along a ground track 262. The parallel-connected FBARs 212, 214, 216 connect nodes interconnecting the series-connected FBARs 211, 213, 215, 217 to respective ground contacts 242, 244, 246 via the ground track 262. In this example, the ground track 262 is connected between the parallel-connected FBARs 212 and 214 through the ground contacts 242 and 244.

The loop circuit 220 including the SAW filter 230 is formed along a loop signal track 263 extending from the signal contact 241 to the signal contact 243. The SAW filter 230 includes the first SAW resonator 232 connected to the signal contact 241 and the second SAW resonator 234 connected to the signal contact 243. As discussed above, the first SAW resonator 232 and the second SAW resonator 234 are arranged adjacent to each other to form a longitudinal-coupling-type filter such that the directions from the signal electrodes to the respective ground electrodes can be oriented the same, and these ground electrodes are both connected to a ground contact 248 via the ground track 262.

The first capacitor 222 is disposed on the loop signal track 263 connecting the signal contact 241 to the SAW filter 230. Further, the second capacitor 224 is disposed on the loop signal track 263 connecting the SAW filter 230 to the signal contact 243.

Figure 4B:
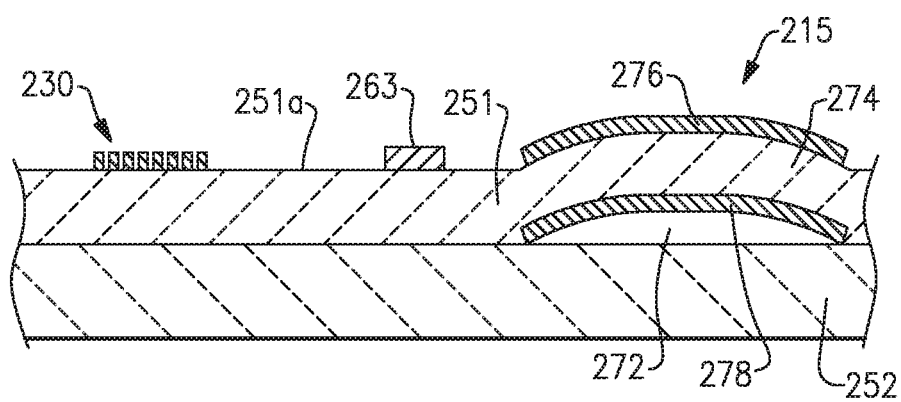
FIG. 4B is a partial cross-sectional view of the filter shown in FIG. 4A.

FIG. 4B is a partial cross-sectional view of the filter as shown in FIG. 4A. The cross-sectional view of FIG. 4B shows the cross section taken along line IV-IV' in FIG. 4A. An interdigital transducer (IDT) electrode forming part of the SAW filter 230 is disposed on the top surface 251a of the piezoelectric substrate 251, which is supported by a support substrate 252. Further, the loop signal track 263 is disposed on the top surface 251a of the piezoelectric substrate 51.

The FBAR 215 is formed in a portion of the piezoelectric substrate 251. In the FBAR 215, a cavity 272 is formed between the piezoelectric substrate 251 and the support substrate 252, and a piezoelectric film 274 is formed by a corresponding portion of the piezoelectric substrate 251. An upper electrode 276 and a lower electrode 278 are formed in the piezoelectric film 274 and allowed to oscillate.

Figure 5:
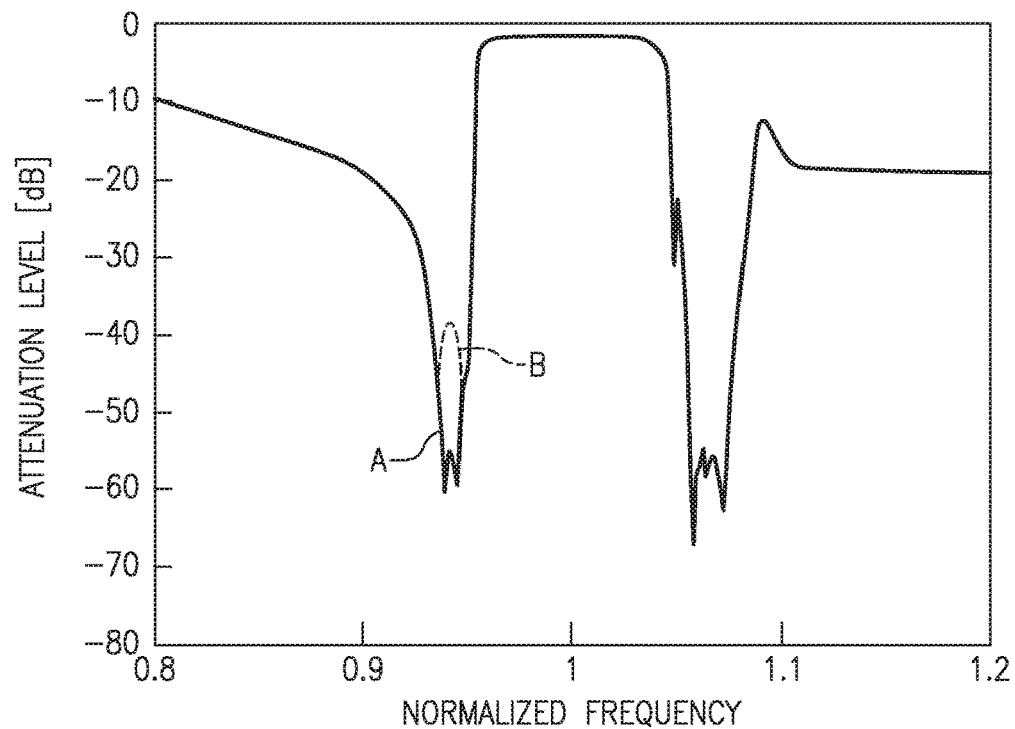
FIG. 5 is a graph showing frequency characteristics of a filter according to one embodiment.

FIG. 5 is a graph showing frequency characteristics of a filter 200 according to one embodiment. The frequency characteristics of this embodiment as indicated by solid line "A" show that the loss in the passband is suppressed and the attenuation level is ensured even near the passband within the stopband. For comparison purposes, frequency characteristics when the loop circuit 220 is removed from the filter are indicated by dashed line "B". In this case, the attenuation characteristics are significantly degraded near the passband on a lower-frequency side of the stopband.

The filter 200 according to certain embodiments includes the loop circuit 220 connected between the input 202 and the output 204 and connected in parallel with the ladder-type filter circuit 210 to enable phase-cancellation of signals between the input and the output. The filter 200 according to these embodiments allows the design parameters of the loop circuit 220 to be optimized such that the loss in the passband can be minimized and the attenuation characteristics within the stopband and near the passband can be improved, as shown in FIG. 5.

Further, according to certain embodiments, the ladder-type filter circuit 210 including the FBARs 211-217 and the loop circuit 220 including the SAW filter 230 are disposed on a common piezoelectric substrate 251, as shown in FIG. 4A. Therefore, the filter 200 can be downsized.

Figure 6:
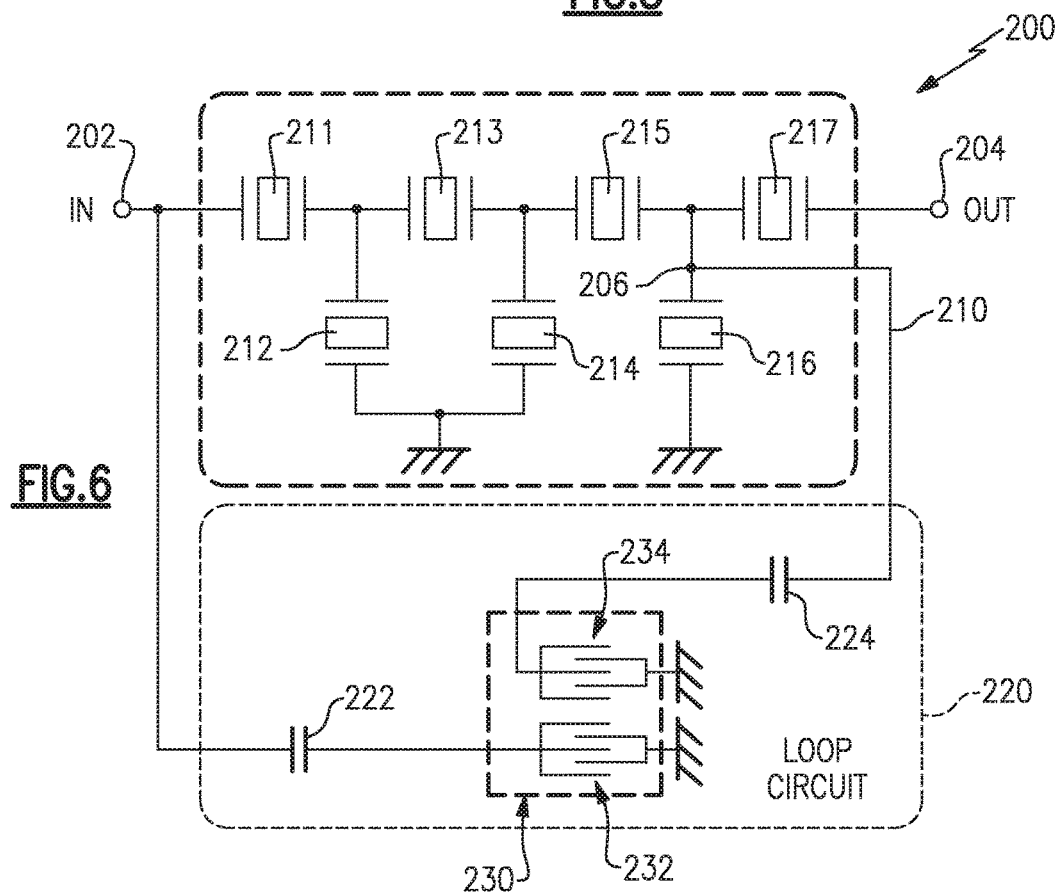
FIG. 6 is a circuit diagram showing a configuration of another example of a filter according to certain aspects.

FIG. 6 is a circuit diagram showing another example of the filter 200 according to certain embodiments. In this example of the filter 200, the loop circuit 220 is connected between the input 202 of the filter and a node located between two FBARs of the ladder-type filter circuit 10. In particular, in the example shown in FIG. 6, the loop circuit 220 is connected at a node 206 located between the series-connected FBAR 217 disposed closest to the output 204 and the preceding series-connected FBAR 215 along the signal path. Thus, the series-connected FBAR 217 is located between the node 206 connected to the loop circuit 220 and the output 204 along the signal path. This is different from the arrangement shown in FIG. 3 in which the loop circuit 220 is connected between the input 202 and the output 204.

In the example shown in FIG. 6, the ladder-type filter circuit 210 formed by FBARs is disposed between the input 202 and the output 204. As discussed above, the series-connected FBARs 211, 213, 215, 217 are connected in series along the signal path in the ladder-type filter circuit 210. Further, the parallel-connected FBARs 212, 214, 216 are connected in parallel between respective nodes interconnecting the series-connected FBARs 211, 213, 215, 217 and the ground. In the example shown in FIG. 6, each of the FBARs 212 and 214 is connected at one end to the ground through a common node.

As discussed above, in the example shown in FIG. 6, the loop circuit 220 is connected between the input 202 and a node 206 interconnecting the series-connected FBARs 215, 217 with the parallel-connected FBAR 216. In other words, the loop circuit 220 is connected between the input of the ladder-type filter circuit 210 and a node positioned one FBAR away from the output along the signal path between the input 202 and the output 204.

The loop circuit 220 includes the longitudinal-coupling-type SAW filter 230. The SAW filter 230 includes the first SAW resonator 232 connected to the input 202 of the ladder-type filter circuit 210 and the second SAW resonator 234 connected to the node 206 interconnecting the series-connected FBARs 215, 217 with the parallel-connected FBAR 216. The first SAW resonator 232 and the second SAW resonator 234 are arranged adjacent to each other to form a longitudinal-coupling-type filter such that the directions from the signal electrodes to the respective ground electrodes can be oriented the same.

Further, the loop circuit 220 includes the first capacitor 222 connected between the input 202 and the longitudinal-coupling-type SAW filter 230. Still further, the loop circuit 220 includes the second capacitor 224 connected between the SAW filter 230 and the node 206.

As discussed above, in the example of the filter 200 shown in FIG. 6, the loop circuit 220 is connected between the input 202 of the ladder-type filter circuit 210 and the node 206 interconnecting the series-connected FBARs 215, 217 with the parallel-connected FBAR 216. With this arrangement, variations in the output impedance can be suppressed and the attenuation characteristics within the stopband can be improved.

It is to be appreciated that although the example of the filter 200 shown in FIG. 6 has a configuration in which the loop circuit 220 is connected between the input 202 and a node 206 located one resonator away from the output 204 along the signal path, other embodiments of the filter 200 are not limited to this configuration. For example, the loop circuit 220 can be connected between a node located one resonator way from the input 202 of the ladder-type filter circuit 210 along the signal path and the output 204 of the ladder-type filter circuit 210. Further, the loop circuit 220 may be connected between two distinct points selected from the input 202 and the output 204 of the ladder-type filter circuit 210 as well as respective nodes interconnecting the series-connected FBARs 211, 213, 215, 217 along the signal path of the ladder-type filter circuit 210.

Figure 7:
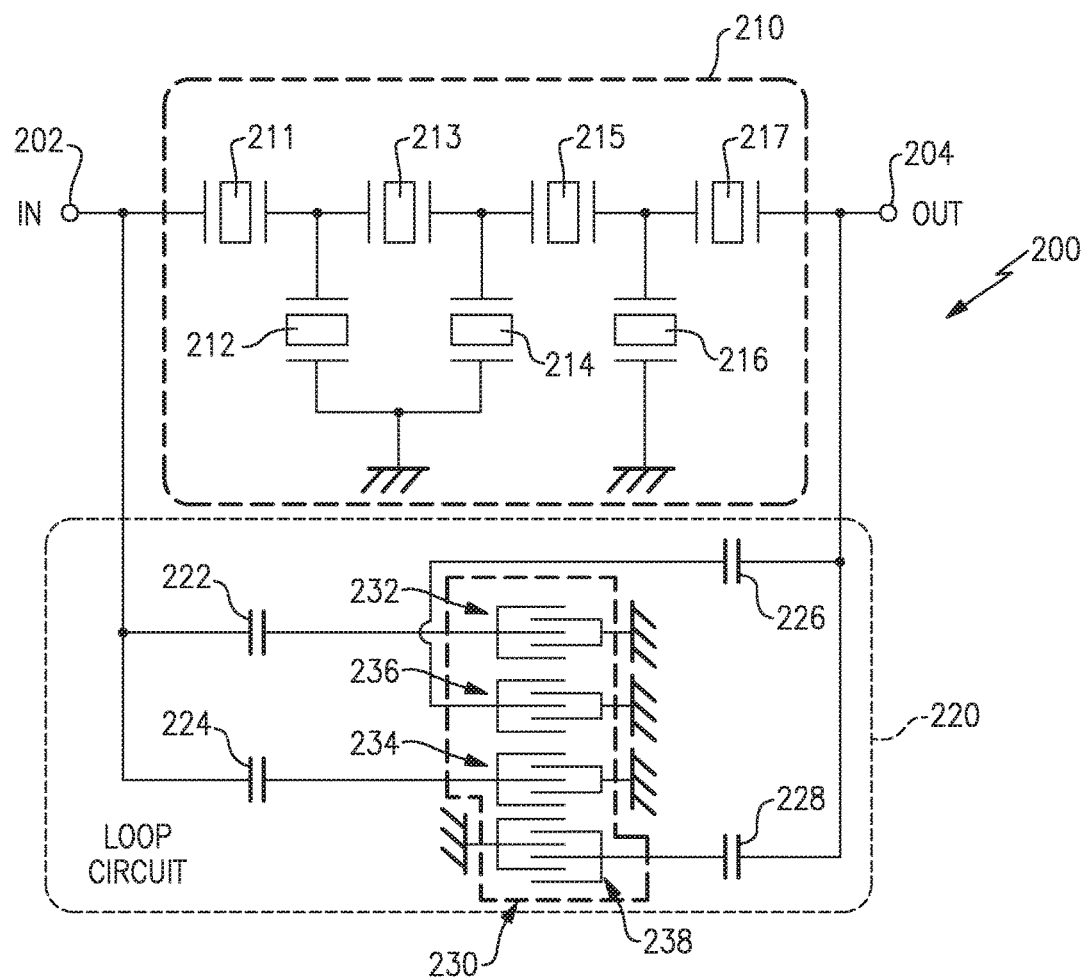
FIG. 7 is a circuit diagram showing another example of a filter according to certain aspects.

FIG. 7 is a circuit diagram showing a configuration of another example of the filter 200 according to one embodiment. In this example of the filter 200, the longitudinal-coupling-type SAW filter 230 of the loop circuit 220 includes four SAW resonators 232, 234, 236, 238. This is different from the example of the filter 200 shown in FIG. 3, in which the SAW filter 230 includes two SAW resonators 232, 234.

The example of the filter 200 shown in FIG. 7 includes the ladder-type filter circuit 210 formed by FBARs and disposed between the input 202 and the output 204. Further, the loop circuit 220 is connected between the input 202 and the output 204 of the ladder-type filter circuit 210 in parallel with the ladder-type filter circuit 210.

As discussed above, the series-connected FBARs 211, 213, 215, 217 are connected in series along the signal path in the ladder-type filter circuit 210. Further, the three parallel-connected FBARs 212, 214, 216 are connected between respective nodes interconnecting the series-connected FBARs 211, 213, 215, 217 and the ground. In this example, each of the FBARs 212, 214 is connected at one end to the ground through a common node, as shown in FIG. 7.

The loop circuit 220 includes the longitudinal-coupling-type SAW filter 230. The SAW filter 230 includes first and second SAW resonators 232 and 234 connected to the input 202 of the ladder-type filter circuit 210, as well as third and fourth SAW resonators 236 and 238 connected to the output 204 of the ladder-type filter circuit 210. These four SAW resonators are arranged adjacent to each other and sequentially as a first SAW resonator 232, a third SAW resonator 236, a second SAW resonator 234, and a fourth SAW resonator 238 to form the longitudinal-coupling-type SAW filter 230. Among these four SAW resonators, the first SAW resonator 232, the third SAW resonator 236 and the second SAW resonator 234 are arranged such that the directions from the signal electrodes to the respective ground electrodes can be oriented the same, whereas the fourth SAW resonator 238 is arranged such that the direction from the signal electrode to the ground electrode is reversely oriented relative to the other SAW resonators.

Further, the loop circuit 220 includes a first capacitor 222 connected between the input 202 of the ladder-type filter circuit 210 and the first SAW resonator 232 and a second capacitor 224 connected between the input 202 of the ladder-type filter circuit 210 and the second SAW resonator 234. Still further, a third capacitor 226 is connected between the third SAW resonator 236 and the output 204 of the ladder-type filter circuit 210, and a fourth capacitor 228 is connected between the fourth SAW resonator 238 and the output 204 of the ladder-type filter circuit 210.

In the example of the filter 200 shown in FIG. 7, the SAW filter 230 includes four SAW resonators 232, 234, 236, 238 to duplex the connections of the loop circuit 220. As such, this duplexing of the loop circuit 220 may broaden the frequency band in which attenuation characteristics are obtained, or may add a frequency band in which attenuation characteristics are obtained.

It is to be appreciated that although the example of the filter 200 shown in FIG. 7 has a configuration in which the connections of the loop circuit 220 are duplicated, other embodiments of the filter 200 are not limited to this configuration. For example, further multiplexing such as triplexing can be applied to the loop circuit 220. In such a case, the frequency band in which attenuation characteristics are obtained can be further broadened, and attenuation characteristics can be obtained over a plurality of frequency bands.

Figure 8:
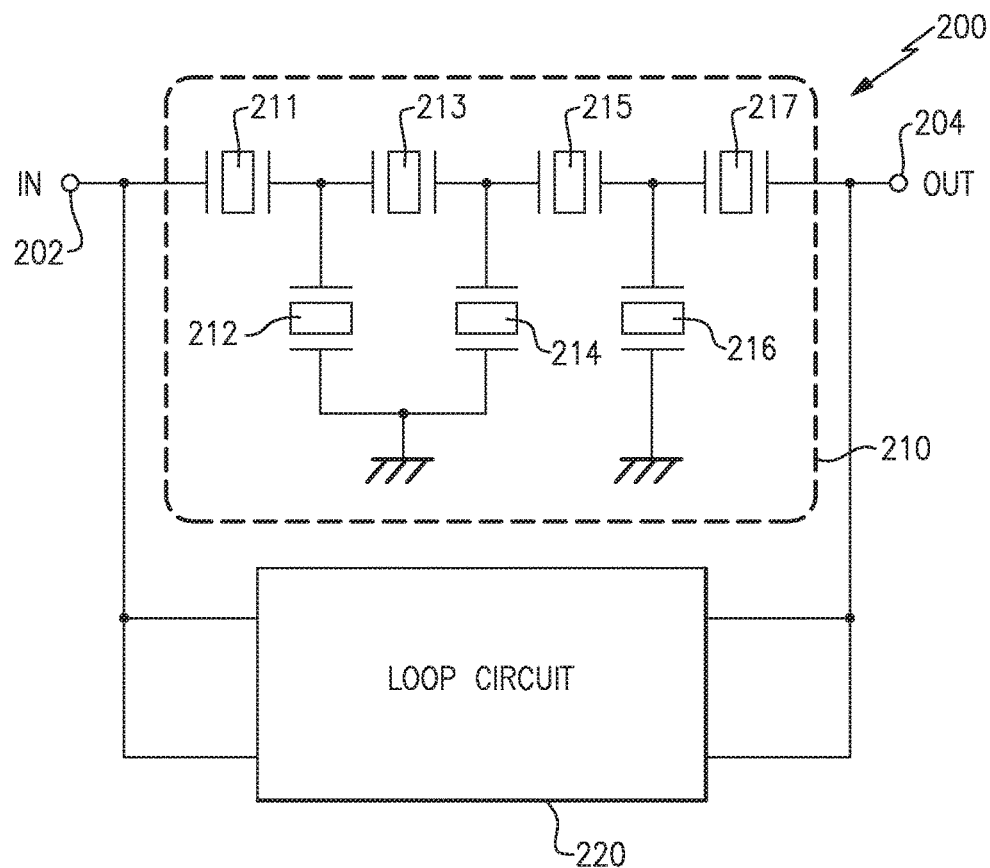
FIG. 8 is a circuit diagram showing another example of a filter according to certain aspects.

FIG. 8 is a circuit diagram showing another example of the filter 200 according to certain embodiments. In this example of the filter 200, the loop circuit 220 is formed by FBARs. This is different from other examples of the filter 200 discussed above in which the loop circuit 220 is formed by SAW resonators. The example of the filter 200 shown in FIG. 8 includes the ladder-type filter circuit 210 formed by FBARs and disposed between the input 202 and the output 204. Further, the loop circuit 220 is connected between the input 202 and the output 204 in parallel with the ladder-type filter circuit 210.

As discussed above, the series-connected FBARs 211, 213, 215, 217 are connected in series along the signal path in the ladder-type filter circuit 210. Further, the three parallel-connected FBARs 212, 214, 216 are connected between respective nodes interconnecting the series-connected FBARs 211, 213, 215, 217 and the ground. In this example, each of the parallel-connected FBARs 212, 214 is connected at one end to the ground through a common node, as shown in FIG. 8.

In FIG. 8, the loop circuit 220 is represented schematically as a box; however, as discussed above, the loop circuit 220 may be a filter formed by FBARs, which can arranged as a ladder-type circuit, for example. In addition, as shown in FIG. 8, the loop circuit 220 may be duplexed or further multiplexed.

Embodiments of the filter 200 in which the loop circuit 220 is formed by FBARs may achieve a technical effect similar to the examples of the loop circuit 220 formed by SAW resonators. In one example, the loop circuit 220 formed by FBARs and the ladder-type filter circuit 210 formed similarly by FBARs are disposed on a common substrate. Therefore, the number of manufacturing steps to form the filter 200 may be reduced through the ability to use common processes to form the ladder-type filter circuit 210 and the loop circuit 220.

It is to be appreciated that although in various embodiments disclosed herein, the BAW resonators have been described as FBARs, other embodiments of the filter 200 are not limited thereto. For example, another BAW resonator, such as solidly mounted resonator (SMR), can be used as a BAW resonator forming the ladder-type filter circuit 210 and/or the loop circuit 220 of the filter 200 according to various embodiments.

Embodiments of the filter 200 can be used in a wide variety of electronic devices and components. For example, embodiments of the filter 200 can be used in a diplexer, triplexer, or antenna duplexer. When the filter 200 is used in an antenna duplexer, as either a transmission filter or a reception filter, the loop circuit 220 can be used to improve the isolation characteristic of the duplexer.

Figure 9:
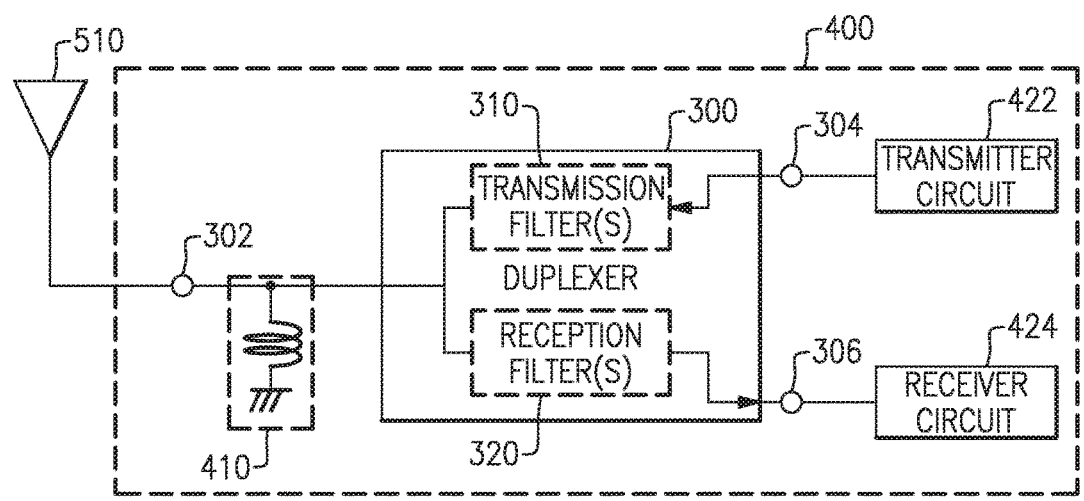
FIG. 9 is a block diagram of one example of a front end module in which filters according to certain embodiments can be used.

Referring to FIG. 9 there is illustrated a block diagram of one example of a front-end module 400, which may be used in an electronic device such as a wireless communications device (e.g., a mobile phone) for example, and which includes an antenna duplexer 300. The antenna duplexer 300 has a common terminal 302, an input terminal 304, and an output terminal 306. An antenna 510 is connected to the common terminal 302. In certain examples, a phase matching component 410, such as an inductor, can be connected to the common terminal 302, as shown. The front-end module 400 further includes a transmitter circuit 422 connected to the input terminal 304 of the duplexer 300 and a receiver circuit 424 connected to the output terminal 306 of the duplexer 300. The transmitter circuit 422 can generate signals for transmission via the antenna 510, and the receiver circuit 424 can receive and process signals received via the antenna 510. In some embodiments such reception and transmission functionalities can be implemented in separate components, as illustrated in FIG. 9, or in a common transceiver circuit/module, as discussed further below. As will be appreciated by those skilled in the art, given the benefit of this disclosure, the front-end module 400 may include other components, not illustrated, such as, but not limited to, switches, electromagnetic couplers, amplifiers, processors, and the like.

The antenna duplexer 300 may include one or more transmission filters 310 connected between the input terminal 304 and the common terminal 302, and one or more reception filters 320 connected between the common terminal 302 and the output terminal 306. The isolation characteristic of the duplexer 300 refers to the passing characteristic from the input terminal 304 to the output terminal 306. An improved isolation characteristic can be obtained in the passbands of the filters 310 and 320 by reducing a level of signal that passes between the input terminal 304 and the output terminal 306. As discussed above, one manner by which this can be achieved is to improve signal attenuation in the stopband(s) of at least one of the filters 310 or 320. According to certain embodiments, to assist in achieving this improved isolation characteristic, any one or more of the transmission filters 310, reception filters 320, or a combination thereof, can be implemented using embodiments of the filter 200 including the phase loop circuit 220 discussed above. In particular, where the loop circuit 220 is used in combination with a transmission filter 310 that is a bandpass filter (and therefore may have more than one stopband), the loop circuit can be configured to improve attenuation in a stopband of the transmission filter 310 that overlaps in frequency with the passband of one or more of the reception filter(s) 320. Similarly, where the loop circuit 220 is used in combination with a reception filter 320 that is a bandpass filter, the loop circuit can be configured to improve attenuation in a stopband of the reception filter 310 that overlaps in frequency with the passband of one or more of the transmission filter(s) 310.

Figure 10:
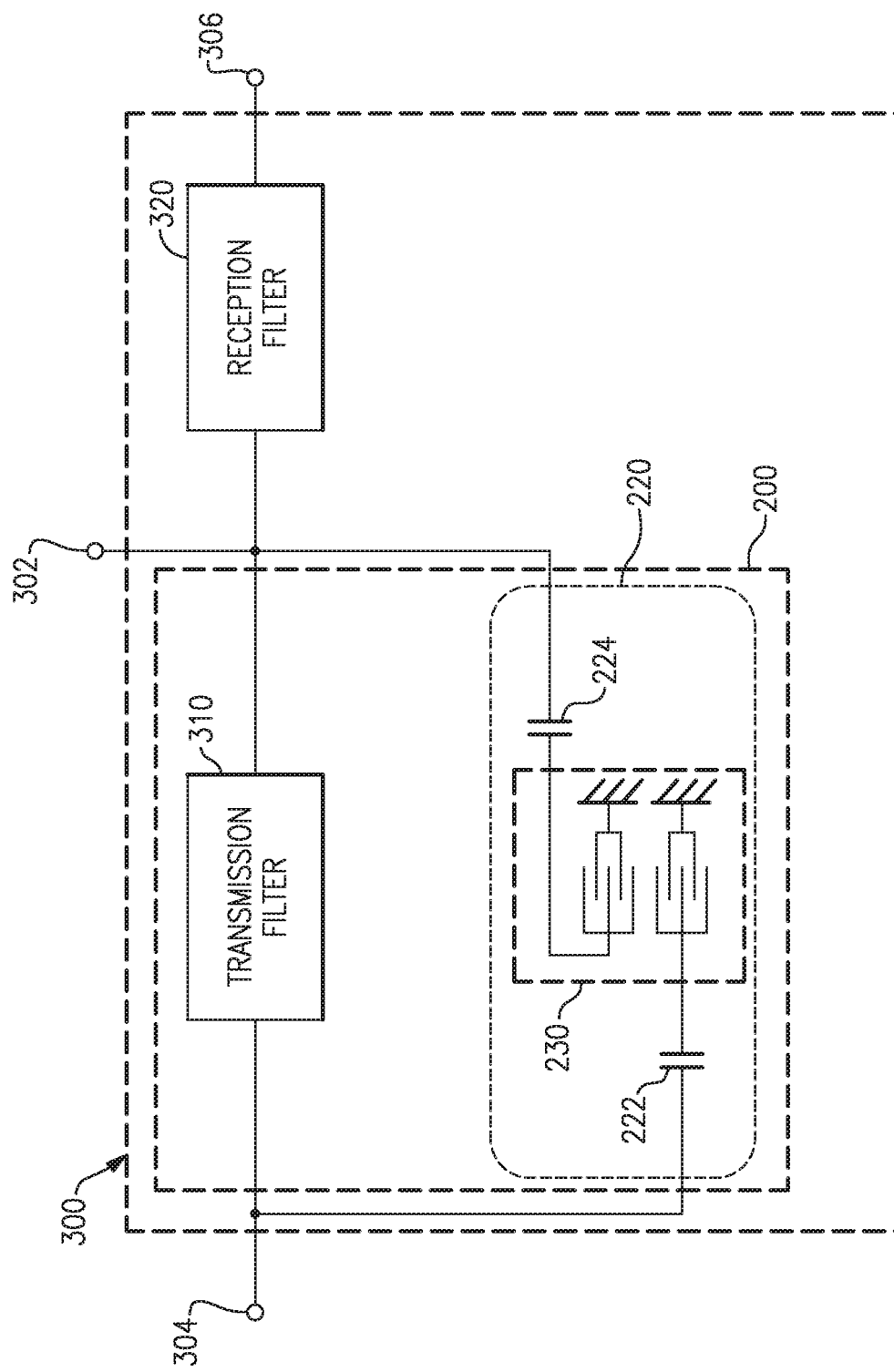
FIG. 10 is block diagram of one example of an antenna duplexer that can be used in the front end module of FIG. 9 according to certain aspects.

FIG. 10 is a diagram of an example of the antenna duplexer 300 including an embodiment of the filter 200 configured to implement the transmission filter 310. Thus, an example of the loop circuit 220 is connected in parallel with the transmission filter 310 between the input terminal 304 and the common terminal 302. In one example the transmission filter 310 has the configuration of the ladder-type filter circuit 210 shown in FIGS. 3 and 6-8. In the example shown in FIG. 10, the transmission filter 310 is implemented using an embodiment of the filter 200; however, in other examples, the reception filter 320 can be implemented using an embodiment of the filter 200. In such an example, the loop circuit 220 can be connected in parallel with the reception filter 320 between the common terminal 302 and the output terminal 306. In other examples, both the transmission filter 310 and the reception filter 320 can be implemented using embodiments of the filter 200.

Embodiments of the antenna duplexer 300 or front end module 400 including embodiments of the filter 200 discussed above may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a wrist watch, a clock, etc. Further, the electronic devices can include unfinished products.

Figure 11:
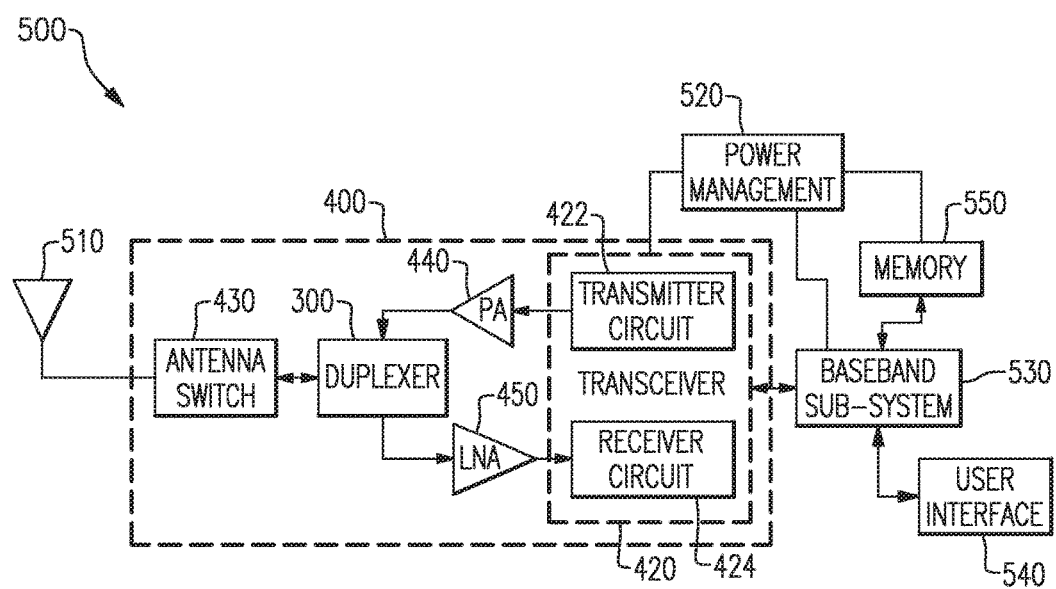
FIG. 11 is a block diagram of one example of a wireless device in which filters according to certain embodiments can be used.

FIG. 11 is a block diagram of one example of a wireless device 500 including the antenna duplexer 300, which as discussed above may be implemented using one or more embodiments of the filter 200 including the loop circuit 220. The wireless device 500 can be a cellular phone, smart phone, tablet, modem, communication network or any other portable or non-portable device configured for voice or data communication. The wireless device 500 can receive and transmit signals from the antenna 510. The wireless device 500 includes the front-end module 400, which includes the duplexer 300 as discussed above. The front-end module 400 further includes an antenna switch 430, which can be configured to switch between different frequency bands or modes, such as transmit and receive modes, for example. In the example illustrated in FIG. 11, the antenna switch 430 is positioned between the duplexer 300 and the antenna 510; however, in other examples the duplexer 300 can be positioned between the antenna switch 430 and the antenna 510, or the antenna switch 430 and the duplexer 300 can be integrated into a single module.

The front end module 400 includes a transceiver 420 that is configured to generate signals for transmission or to process received signals. The transceiver 420 can include the transmitter circuit 422 which can be connected to the input terminal 304 of the duplexer 300, and the receiver circuit 424 which can be connected to the output terminal 306 of the duplexer 300, as shown in FIG. 9. Signals generated for transmission by the transmitter circuit 422 are received by a power amplifier (PA) module 440, which amplifies the generated signals from the transceiver 420. As will be appreciated by those skilled in the art, the power amplifier module 440 can include one or more power amplifiers. The power amplifier module 440 can be used to amplify a wide variety of RF or other frequency-band transmission signals. For example, the power amplifier module 440 can receive an enable signal that can be used to pulse the output of the power amplifier to aid in transmitting a wireless local area network (WLAN) signal or any other suitable pulsed signal. The power amplifier module 440 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 440 and associated components including switches and the like can be fabricated on GaAs substrates using, for example, pHEMT or BiFET transistors, or on a Silicon substrate using CMOS transistors. The front-end module 400 further includes a low noise amplifier module 450, which amplifies received signals from the antenna 510 and provides the amplified signals to the receiver circuit 424 of the transceiver 420.

The wireless device 500 of FIG. 11 further includes a power management sub-system 520 that is connected to the transceiver 420 and that manages the power for the operation of the wireless device. The power management system 520 can also control the operation of a baseband sub-system 530 and other components of the wireless device 500. The power management system 520 can include, or can be connected to, a battery (not shown) that supplies power for the various components of the wireless device 500. The power management system 520 can further include one or more processors or controllers that can control the transmission of signals, for example.

In one embodiment, the baseband sub-system 530 is connected to a user interface 540 to facilitate various input and output of voice or data provided to and received from the user. The baseband sub-system 530 can also be connected to a memory 550 that is configured to store data or instructions to facilitate the operation of the wireless device 500, or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, it is to be appreciated that embodiments discussed herein are not limited in application to the details of construction and the arrangement of components set forth in the description or illustrated in the accompanying drawings. The devices disclosed herein are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Accordingly, the foregoing description and drawings are by way of example only, and the scope of the invention should be determined from proper construction of the appended claims, and their equivalents.

What is claimed is:

1. A filtering circuit comprising:
 a ladder-type filter having an input and an output, the ladder-type filter including a plurality of series-arm acoustic wave elements connected in series along a signal path between the input and the output, and a plurality of parallel-arm acoustic wave elements connected between the signal path and a ground, each series-arm acoustic wave element and each parallel-arm acoustic wave element being a bulk acoustic wave element; and
 a loop circuit connected in parallel with the ladder-type filter between the input and output, the loop circuit including an acoustic wave filter, a first capacitor, a second capacitor, a third capacitor, and a fourth capacitor, the first capacitor being connected to the input, the second capacitor being connected to the output, and the acoustic wave filter being connected in series between the first and second capacitors, the acoustic wave filter including a first acoustic wave element, a second acoustic wave element, a third acoustic wave element, and a fourth acoustic wave element, the third capacitor being connected between the third acoustic wave element and the input, and the fourth capacitor being connected between the fourth acoustic wave element and the output, the first and second acoustic wave elements each having a signal electrode and a ground electrode, and being arranged such that a direction from the signal electrode to the ground electrode is oriented the same in each of the first and second acoustic wave elements.

2. The filtering circuit of claim 1 wherein each bulk acoustic wave element is a film bulk acoustic resonator.

3. The filtering circuit of claim 1 wherein each bulk acoustic wave element is a solidly mounted resonator.

4. The filtering circuit of claim 1 wherein the acoustic wave filter is a longitudinally-coupled surface acoustic wave filter, and each of the first and second acoustic wave elements of the loop circuit is a surface acoustic wave element.

5. The filtering circuit of claim 1 wherein the plurality of series-arm acoustic wave elements and the plurality of parallel-arm acoustic wave elements of the ladder-type filter and the acoustic wave filter of the loop circuit are formed on a common substrate.

6. The filtering circuit of claim 1 wherein each of the third and fourth acoustic wave elements includes a signal electrode and a ground electrode, the first, second, and third acoustic wave elements being arranged such that the direction from the signal electrode to the ground electrode is a first direction, and the fourth acoustic wave element being oriented such that a direction from the signal electrode to the ground electrode is a second direction opposite to the first direction.

7. The filtering circuit of claim 1 wherein each of the first and second acoustic wave elements of the loop circuit is a bulk acoustic wave element.

8. The filtering circuit of claim 7 wherein each of the first and second acoustic wave elements of the loop circuit is a film bulk acoustic resonator.

9. The filtering circuit of claim 7 wherein each of the first and second acoustic wave elements of the loop circuit is a solidly mounted resonator.

10. A filtering circuit comprising:
 a ladder-type filter including a plurality of series-arm acoustic wave elements connected in series along a signal path between an input and an output, the ladder-type filter further including a plurality of parallel-arm acoustic wave elements connected between the signal path and a ground; and
 a loop circuit including a first capacitor, a second capacitor, and an acoustic wave filter connected in series between the first capacitor and the second capacitor, the first capacitor being connected to the input, and the second capacitor being connected at a node along the signal path, a first parallel-arm acoustic wave element of the plurality of parallel-arm acoustic wave elements being connected between the node and the ground, and a single series-arm acoustic wave element of the plurality of series-arm acoustic wave elements being connected between the node and the output, the acoustic wave filter including a first acoustic wave element and a second acoustic wave element, each of the first and second acoustic wave elements having a signal electrode and a ground electrode and being arranged such that a direction from the signal electrode to the ground electrode is oriented the same in each of the first and second acoustic wave elements.

11. The filtering circuit of claim 10 wherein each series-arm acoustic wave element and each parallel-arm acoustic wave element is a bulk acoustic wave element.

12. The filtering circuit of claim 11 wherein each bulk acoustic wave element is one of a film bulk acoustic resonator and a solidly mounted resonator.

13. The filtering circuit of claim 11 wherein the plurality of series-arm acoustic wave elements and the plurality of parallel-arm acoustic wave elements of the ladder-type filter and the acoustic wave filter of the loop circuit are formed on a common substrate.

14. The filtering circuit of claim 10 wherein each of the first and second acoustic wave elements of the loop circuit is a bulk acoustic wave element.

15. The filtering circuit of claim 14 wherein each bulk acoustic wave element is one of a film bulk acoustic resonator and a solidly mounted resonator.

16. The filtering circuit of claim 10 wherein the acoustic wave filter is a longitudinally-coupled surface acoustic wave filter, and each of the first and second acoustic wave elements of the loop filter is a surface acoustic wave element.

17. A filtering circuit comprising:
a primary filter including a plurality of primary acoustic wave elements constructed and arranged to provide the primary filter with a passband and a stopband, the plurality of primary acoustic wave elements including a plurality of series-arm acoustic wave elements connected in series along a signal path between an input of the filtering circuit and an output of the filtering circuit, and a plurality of parallel-arm acoustic wave elements connected between the signal path and a ground; and
a loop circuit including a first capacitor, a second capacitor, and an acoustic wave filter connected in series between the first capacitor and the second capacitor, the first capacitor being connected at an input of the primary filter, the second capacitor being connected at a node along the signal path of the primary filter, a first parallel-arm acoustic wave element of the plurality of parallel-arm acoustic wave elements being connected between the node and the ground, and at least one series-arm acoustic wave element of the plurality of series-arm acoustic wave elements being connected between the node and the output of the primary filter, the acoustic wave filter including a first and second secondary acoustic wave elements each having a signal electrode and a ground electrode and being arranged such that a direction from the signal electrode to the ground electrode is oriented the same in each of the first and second secondary acoustic wave elements, and the loop circuit being configured to attenuate a portion of a signal in the stopband of the primary filter by signal phase cancellation.

18. The filtering circuit of claim 17 wherein the acoustic wave filter of the loop circuit is a longitudinally-coupled surface acoustic wave filter, and each of the first and second acoustic wave elements is a surface acoustic wave element.

19. The filtering circuit of claim 17 wherein each of the primary acoustic wave elements is a film bulk acoustic resonator and wherein the plurality of primary acoustic wave elements and the acoustic wave filter are formed on a common substrate.

20. The filtering circuit of claim 17 wherein each of the primary acoustic wave elements is one of a film bulk acoustic resonator and a solidly mounted resonator.

* * * * *